United States Patent
Yeh et al.

(10) Patent No.: US 12,412,595 B2
(45) Date of Patent: Sep. 9, 2025

(54) AUTOMATIC LEVELING OF SPEECH CONTENT

(71) Applicants: Dolby Laboratories Licensing Corporation, San Francisco, CA (US); Dolby International AB, Amsterdam (NL)

(72) Inventors: Chunghsin Yeh, Barcelona (ES); Giulio Cengarle, Barcelona (ES); Mark David de Burgh, San Francisco, CA (US)

(73) Assignees: Dolby Laboratories Licensing Corporation, San Francisco, CA (US); Dolby International AB, Amsterdam (NL)

( * ) Notice: Subject to any disclaimer, the term of this patent is extended or adjusted under 35 U.S.C. 154(b) by 0 days.

(21) Appl. No.: 17/915,074

(22) PCT Filed: Mar. 25, 2021

(86) PCT No.: PCT/US2021/024232
§ 371 (c)(1),
(2) Date: Sep. 27, 2022

(87) PCT Pub. No.: WO2021/195429
PCT Pub. Date: Sep. 30, 2021

(65) Prior Publication Data
US 2023/0162754 A1    May 25, 2023

Related U.S. Application Data

(60) Provisional application No. 63/126,889, filed on Dec. 17, 2020, provisional application No. 63/032,158, filed on May 29, 2020.

(30) Foreign Application Priority Data

Mar. 27, 2020    (ES) ............................... ES202000051

(51) Int. Cl.
*G10L 21/0364*    (2013.01)
*G10L 17/20*    (2013.01)
(Continued)

(52) U.S. Cl.
CPC .......... *G10L 21/0364* (2013.01); *G10L 17/20* (2013.01); *G10L 21/028* (2013.01);
(Continued)

(58) Field of Classification Search
CPC ... G10L 21/0364; G10L 17/20; G10L 21/028; G10L 21/034; G10L 25/21; G10L 25/30; G10L 25/84; G10L 2025/786
See application file for complete search history.

(56) References Cited

U.S. PATENT DOCUMENTS 6,415,253 B1    7/2002    Johnson
6,651,040 B1    11/2003    Bakis
(Continued)

FOREIGN PATENT DOCUMENTS

CN    101647059 A    2/2010
CN    102804261 A    11/2012
(Continued)

OTHER PUBLICATIONS

EBU-Recommendation, R. (2011). Loudness normalisation and permitted maximum level of audio signals. European Broadcasting Union. (Year: 2011).*
(Continued)

*Primary Examiner* — Bhavesh M Mehta
*Assistant Examiner* — Philip H Lam

(57) ABSTRACT

Embodiments are disclosed for automatic leveling of speech content. In an embodiment, a method comprises: receiving, using one or more processors, frames of an audio recording including speech and non-speech content; for each frame: determining, using the one or more processors, a speech
(Continued)

probability; analyzing, using the one or more processors, a perceptual loudness of the frame; obtaining, using the one or more processors, a target loudness range for the frame; computing, using the one or more processors, gains to apply to the frame based on the target loudness range and the perceptual loudness analysis, where the gains include dynamic gains that change frame-by-frame and that are scaled based on the speech probability; and applying the gains to the frame so that a resulting loudness range of the speech content in the audio recording fits within the target loudness range.

20 Claims, 3 Drawing Sheets

(51) Int. Cl.
| | |
|---|---|
| *G10L 21/028* | (2013.01) |
| *G10L 21/034* | (2013.01) |
| *G10L 25/21* | (2013.01) |
| *G10L 25/30* | (2013.01) |
| *G10L 25/78* | (2013.01) |
| *G10L 25/84* | (2013.01) |

(52) U.S. Cl.
CPC ........... *G10L 21/034* (2013.01); *G10L 25/21* (2013.01); *G10L 25/30* (2013.01); *G10L 25/84* (2013.01); *G10L 2025/786* (2013.01)

(56) References Cited

U.S. PATENT DOCUMENTS

| | | | |
|---|---|---|---|
| 7,742,746 B2 | 6/2010 | Xiang | |
| 7,848,531 B1 | 12/2010 | Vickers | |
| 8,121,835 B2 | 2/2012 | Archibald | |
| 8,407,045 B2 | 3/2013 | Erell | |
| 8,428,949 B2 | 4/2013 | Neoran | |
| 9,350,312 B1 | 5/2016 | Wishnick | |
| 9,495,970 B2 | 11/2016 | Dickins | |
| 9,509,267 B2 | 11/2016 | Patwardhan | |
| 9,559,651 B2 | 1/2017 | Baumgarte | |
| 9,841,941 B2 | 12/2017 | Riedmiller | |
| 9,842,596 B2 | 12/2017 | Riedmiller | |
| 9,842,605 B2 | 12/2017 | Lu | |
| 10,147,436 B2 | 12/2018 | Riedmiller | |
| 10,355,658 B1* | 7/2019 | Yang | H03G 9/025 |
| 10,448,161 B2 | 10/2019 | Xiang | |
| 10,546,590 B2 | 1/2020 | Sharma | |
| 11,164,592 B1* | 11/2021 | Wu | G10L 21/034 |
| 2006/0184366 A1* | 8/2006 | Hidaka | G10L 25/00 |
| | | | 704/E11.001 |
| 2009/0009251 A1* | 1/2009 | Spielbauer | H03G 3/001 |
| | | | 330/278 |
| 2009/0257335 A1* | 10/2009 | Lin | G10L 21/04 |
| 2010/0017203 A1 | 1/2010 | Archibald | |
| 2010/0094625 A1* | 4/2010 | Mohammad | G10L 25/78 |
| | | | 704/233 |
| 2011/0071825 A1* | 3/2011 | Emori | G10L 25/78 |
| | | | 704/E15.039 |
| 2012/0123769 A1 | 5/2012 | Urata | |
| 2012/0221328 A1* | 8/2012 | Muesch | G10L 25/93 |
| | | | 704/E21.002 |
| 2012/0263317 A1 | 10/2012 | Shin | |
| 2013/0304464 A1* | 11/2013 | Wang | G10L 19/22 |
| | | | 704/233 |
| 2014/0074467 A1* | 3/2014 | Ziv | G10L 25/51 |
| | | | 704/235 |
| 2015/0332685 A1* | 11/2015 | Bleidt | G10L 19/26 |
| | | | 704/500 |
| 2016/0042746 A1* | 2/2016 | Fujieda | G10L 21/0232 |
| | | | 704/226 |
| 2016/0322067 A1* | 11/2016 | Sehlstedt | G10L 25/87 |
| 2016/0358618 A1* | 12/2016 | Chen | H04S 7/30 |
| 2017/0345439 A1* | 11/2017 | Jensen | H04R 25/505 |
| 2018/0234069 A1* | 8/2018 | De Burgh | H03G 5/165 |
| 2019/0318758 A1* | 10/2019 | Ma | G10L 21/04 |
| 2020/0112294 A1* | 4/2020 | Mabande | G06F 3/165 |
| 2020/0176012 A1* | 6/2020 | Herbig | G10L 21/034 |
| 2021/0074282 A1* | 3/2021 | Borgstrom | G10L 25/84 |
| 2021/0152934 A1* | 5/2021 | Tu | H04R 3/007 |
| 2021/0352408 A1* | 11/2021 | Honma | H04S 3/008 |
| 2021/0367574 A1* | 11/2021 | Chon | H03G 7/002 |
| 2022/0148571 A1* | 5/2022 | Wang | G10L 21/02 |

FOREIGN PATENT DOCUMENTS

| | | | | |
|---|---|---|---|---|
| CN | 105190750 A | | 12/2015 | |
| CN | 107994879 B | | 5/2018 | |
| EP | 3340657 A1 * | | 6/2018 | G10L 25/84 |
| KR | 101704926 B1 * | | 2/2017 | |
| WO | 2018188812 A1 | | 10/2018 | |

OTHER PUBLICATIONS

Molinder, H. (2016). Adaptive Normalisation of Programme Loudness in Audiovisual Broadcasts. (Year: 2016).*
Plapous, C., Marro, C., & Scalart, P. (2006). Improved signal-to-noise ratio estimation for speech enhancement. IEEE transactions on audio, speech, and language processing, 14(6), 2098-2108. (Year: 2006).*
Zheng, Y., & Lin, Z. (2003). Recursive adaptive algorithms for fast and rapidly time-varying systems. IEEE Transactions on Circuits and Systems II: Analog and Digital Signal Processing, 50(9), 602-614. (Year: 2003).*
https://www.waves.com/plugins/vocal-rider?gclid=EAlaIQobChMIirgk_vu5wIV0_ZRCh1eDQErEAAYASAAEgKjlvD_BwE#achieving-perfect-vocallevels-with-vocal-rider.
https://www.izotope.com/en/products/rx/features/leveler.html.
ITU-R BS. 1770-4, "Algorithms to Measure Audio Programme Loudness and True-Peak Audio Level" Oct. 2015, pp. 1-25.
Maddams, J. A. et al "An Autonomous Method for Multi-Track Dynamic Range Compression" Proc. of the 15th Int. Conference on Digital Audio Effects, Sep. 17-21, 2012.
Moore, B. C.J. et al."A Model for the Prediction of Thresholds, Loudness, and Partial Loudness" 1997, AES.
Zwicker, E. et al "Program for Calculating Loudness according to DIN 45631" JST, 1991, vol. 12 Issue 1 pp. 39-42.

* cited by examiner

AUTOMATIC LEVELING OF SPEECH CONTENT

CROSS-REFERENCE TO RELATED APPLICATIONS

This application claims priority to U.S. Provisional Application No. 63/126,889 filed on Dec. 17, 2020 and U.S. Provisional Application No. 63/032,158 filed on May 29, 2020 and ES Patent Application No. P202000051 filed on Mar. 27, 2020, each of which is incorporated by reference in its entirety.

TECHNICAL FIELD

This disclosure relates generally to audio signal processing.

BACKGROUND

Speech content represents a significant part of media delivery and consumption, with many content creators producing speech-based media such as podcasts, audio books, interviews and lectures. In the production of speech content, the recording stage is usually followed by editing and processing stages, where the raw recordings are polished and processed to comply with the standards of quality that people have been accustomed to by the broadcasting industry, therefore guaranteeing a proper listening experience through a variety of devices by ensuring intelligibility, loudness consistency and a correct timbral balance.

The editing and processing stages are usually carried out manually using analogue or digital processing devices (hardware, software or combinations of both), where skilled engineers apply gain controls, equalization, compression, noise reduction, sibilance reduction and other similar processing to the speech recordings. This workflow is time consuming because the sound engineers need to consider the whole duration of the recording to process it. With increasing amounts of speech content being generated, it is valuable to provide tools for automating and speeding-up the editing and processing stages, while ensuring a professional quality of speech naturalness with lack of processing artifacts. One of the processes that is typically applied to speech is leveling, where a gain control (manual or automatic) is applied to the audio making sure it keeps a consistent loudness level, so that the soft parts of the speech remain intelligible and the loud parts of the speech are not inappropriately loud.

Leveling of speech content is typically done in two ways: by means of manual gain adjustments (e.g., riding the faders of a console, or drawing a gain automation curve on a digital audio workstation), or using dynamic compressors where a threshold level is set, and gain reduction is automatically applied to the audio fragments whose levels exceed the threshold. The first approach usually gives the best results but is time consuming. Also, the manual leveling approach does not ensure that the output audio fits into the desired loudness range for any loudness range of the input audio. The second approach of using one or more dynamic compressors to level speech content is not as effective as the manual approach, and may lead to quality degradation when lots of gain reduction is required.

SUMMARY

Implementations are disclosed for automatic leveling of speech content.

In an embodiment, a method comprises: receiving, using one or more processors, frames of an audio recording including speech and non-speech content; for each frame: determining, using the one or more processors, a speech probability; analyzing, using the one or more processors, a perceptual loudness of the frame; obtaining, using the one or more processors, a target loudness range for the frame; computing, using the one or more processors, gains to apply to the frame based on the target loudness range and the perceptual loudness analysis, where the gains include dynamic gains that change frame-by-frame and that are scaled based on the speech probability; and applying, using the one or more processors, the gains to the frame so that a resulting loudness range of the speech content in the audio recording fits within the target loudness range.

Other implementations disclosed herein are directed to a system, apparatus and computer-readable medium. The details of the disclosed implementations are set forth in the accompanying drawings and the description below. Other features, objects and advantages are apparent from the description, drawings and claims.

Particular implementations disclosed herein provide one or more of the following advantages. The loudness of speech content is automatically leveled by applying a time-varying gain, so that soft sections of speech are boosted and loud sections are attenuated. The quality of the results is comparable to the manual leveling approaches with the advantage that the level of the output speech content fits into the desired loudness range for any loudness range of the input speech content. Additionally, there is no significant degradation of output speech content when lots of gain reduction is required.

DESCRIPTION OF DRAWINGS

In the drawings, specific arrangements or orderings of schematic elements, such as those representing devices, units, instruction blocks and data elements, are shown for ease of description. However, it should be understood by those skilled in the art that the specific ordering or arrangement of the schematic elements in the drawings is not meant to imply that a particular order or sequence of processing, or separation of processes, is required. Further, the inclusion of a schematic element in a drawing is not meant to imply that such element is required in all embodiments or that the features represented by such element may not be included in or combined with other elements in some implementations.

Further, in the drawings, where connecting elements, such as solid or dashed lines or arrows, are used to illustrate a connection, relationship, or association between or among two or more other schematic elements, the absence of any such connecting elements is not meant to imply that no connection, relationship, or association can exist. In other words, some connections, relationships, or associations between elements are not shown in the drawings so as not to obscure the disclosure. In addition, for ease of illustration, a single connecting element is used to represent multiple connections, relationships or associations between elements. For example, where a connecting element represents a communication of signals, data, or instructions, it should be understood by those skilled in the art that such element represents one or multiple signal paths, as may be needed, to affect the communication.

The same reference symbol used in various drawings indicates like elements.

DETAILED DESCRIPTION

Figure 1:
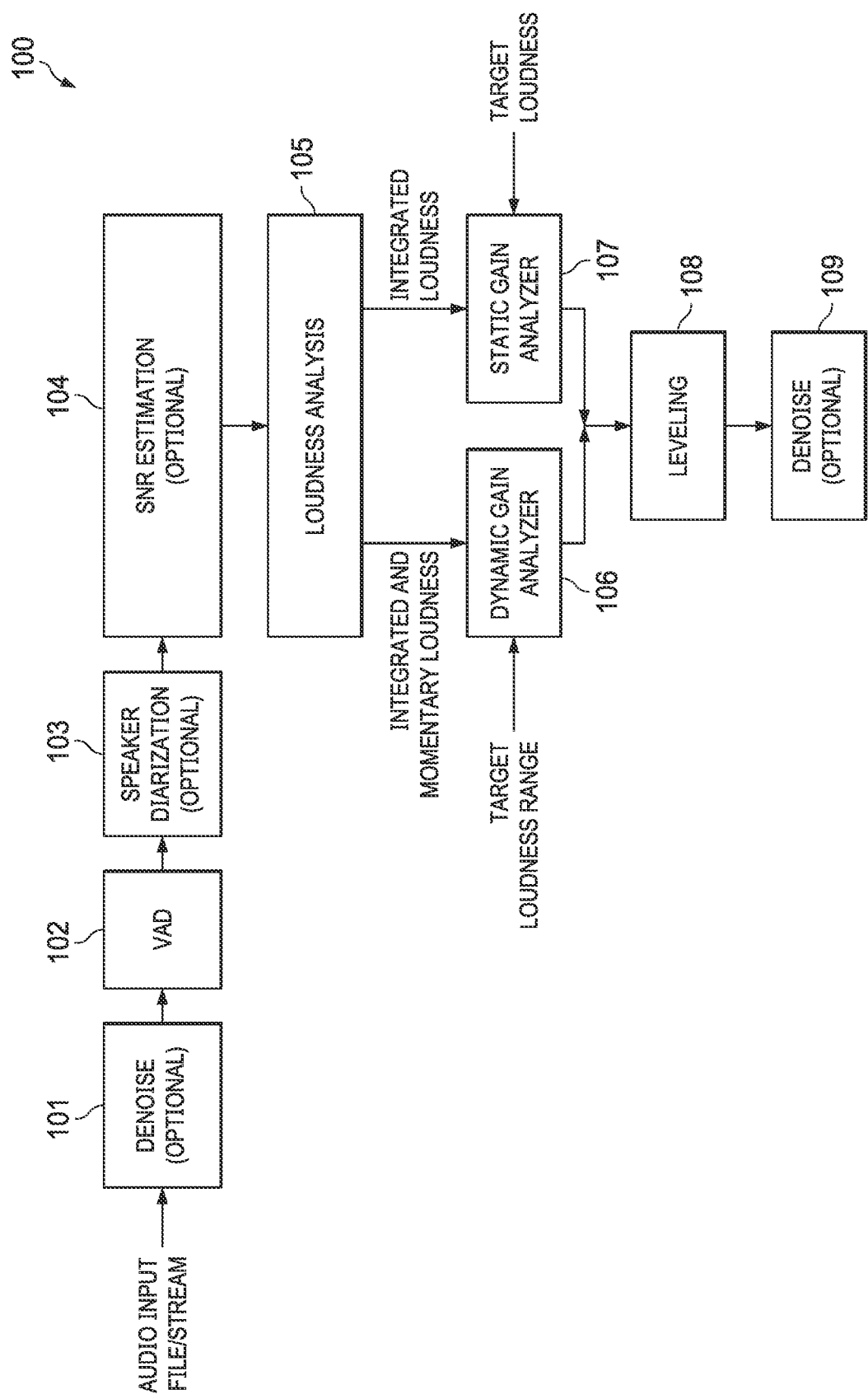
FIG. 1 is a block diagram of a system for automatic leveling of speech content, according to an embodiment.

In the following detailed description, numerous specific details are set forth to provide a thorough understanding of the various described embodiments. It will be apparent to one of ordinary skill in the art that the various described implementations may be practiced without these specific details. In other instances, well-known methods, procedures, components, and circuits, have not been described in detail so as not to unnecessarily obscure aspects of the embodiments. Several features are described hereafter that can each be used independently of one another or with any combination of other features.

Nomenclature

As used herein, the term "includes" and its variants are to be read as open-ended terms that mean "includes, but is not limited to." The term "or" is to be read as "and/or" unless the context clearly indicates otherwise. The term "based on" is to be read as "based at least in part on." The term "one example implementation" and "an example implementation" are to be read as "at least one example implementation." The term "another implementation" is to be read as "at least one other implementation." The terms "determined," "determines," or "determining" are to be read as obtaining, receiving, computing, calculating, estimating, predicting or deriving. In addition, in the following description and claims, unless defined otherwise, all technical and scientific terms used herein have the same meaning as commonly understood by one of ordinary skills in the art to which this disclosure belongs.

System Overview

This disclosure describes a method for automatically leveling the loudness of speech content by applying a time-varying gain, so that soft sections of speech are boosted, and loud sections are attenuated. In an exemplary embodiment, there are six parts. The first part is the inclusion of a Voice Activity Detector (VAD) to modify the gain as a function of the probability of speech presence. The VAD is particularly helpful to adapt the gain to avoid unnecessary boost of soft non-speech parts. The second part is an optional signal-to-noise ratio (SNR) estimator to automate some leveling parameters. The third part is the inclusion of an optional Speaker Diarization (SD) for segmenting the content according to speaker identities. The leveling process is then applied to the respective speaker's segments independently, which is particularly useful for multi-speaker content. The fourth part is the inclusion of an optional denoising module to attenuate background noise before or after the leveling processing. The fifth part is a loudness analysis stage that extracts loudness information for long-term and the short-term time scales, including integrated loudness, momentary loudness and loudness range.

In an offline embodiment, the whole recording is available and the lookahead is therefore infinite in that the algorithm is making local decisions based on the whole recording to ensure that all available information in the recording is used. In an embodiment, the extracted information is saved as metadata to be used with a subsequent gain processing stage. In a real-time embodiment, the long-term information is updated in an online fashion.

The sixth part makes use of the analysis information from the other parts to estimate the gain for each frame of the audio recording to bring the loudness within a target range. The gains are adjusted according to VAD/SNR output to avoid boosting non-speech content.

FIG. 1 is a block diagram of an automated speech leveling system 100, according to an embodiment. System 100 includes optional denoise unit 101, VAD unit 102, optional speaker diarization 103, optional SNR estimation unit 104, loudness analyzer 105, dynamic gain analyzer 106, static gain analyzer 107, leveling unit 108 and optional denoise unit 109. System 100 operates on frames of and audio input file or stream. In some embodiments, each frame of audio input includes N ms of audio (e.g., 85 ms) with X % overlap (e.g., 50% overlap) with adjacent frames. In other embodiments, any suitable windowing function can be used.

Referring to the top of FIG. 1, in some embodiments optional denoise unit 101 takes as input a frame of the audio input file or stream and removes background noise from the frame. In case the robustness of VAD is sensitive to low SNR speech content, it is preferred to apply denoise unit 101 to the frame before VAD 102 as shown. This will also allow a more relevant loudness analysis by loudness analyzer 105. In some embodiments, the optional SNR estimation unit 104 produces an SNR estimate for the entire audio recording. In other embodiments, the optional SNR estimation unit 104 adapts to each speaker using the information provided by the optional speaker diarization unit 103. The SNR estimate is used to drive some parameters to ensure robust operation of leveling unit 108 in the presence of noise, including any of the following: adjusting the amount of leveling being applied, so that leveling is reduced as SNR decreases, to avoid excessive amplitude modulation of the background noise; adjusting the sensitivity of the VAD by postprocessing the speech probabilities in a way that increases the discrimination between speech and non-speech when SNR indicates clean speech; and adjusting the target loudness range so a small dynamic range is only achieved when the signal is sufficiently clean.

The denoised frame is then input into VAD 102 which is configured to discriminate between speech content and non-speech content. In some embodiments, VAD 102 returns a probability that the frame contains speech. In some embodiments, the probability output by VAD 102 is a real number in the range 0.0 to 1.0, where 0.0 indicates that the frame contains no speech, and 1.0 indicates that the frame certainly contains speech. In some embodiments, these output values are interpreted as the likelihood of the frame containing speech. In some embodiments, the VAD output values are smoothed across frames by a moving average, a first order recursive filter or any other suitable filter. In some embodiments, the output values are converted into binary values 0 or 1 (or Boolean values) if they are respectively smaller or larger than a threshold. In some embodiments, the VAD output values are stored in memory or written to file for subsequent use by leveling unit 108 described below. In some embodiments, the VAD output values are computed in real time during the recording process, and stored for later use by leveling unit 108 stage, thus avoiding an additional VAD pass. In some embodiments, the speech probability is computed by a deep neural network (e.g., a recurrent neural network (RNN), Long Short-Term Memory (LSTM)) trained on various types of speech content.

In some embodiments, the discrimination between speech and non-speech is based on applying a threshold to the broadband energy level of the frame, such that frames with energy below the threshold are considered non-speech frames or background noise. Alternatively, the energy level of the frame can be band-limited instead of broadband, for example considering only the typical frequency range of speech (e.g., 100 Hz to 4 kHz).

The output of VAD 102 is input into optional speaker diarization unit 103. For multi-speaker content, speaker diarization is useful for applying leveling to each speaker independently. It not only gives control to the loudness dynamics of each speaker but also allows adapting the leveling parameters to different SNRs of the recording condition of each speaker. In some embodiments, the speaker diarization unit 103 outputs time indices where each speaker is actively dominant. The segments belonging to a speaker are considered as a whole and the leveling process is applied independently to each speaker.

Loudness analyzer 105 receives VAD/SNR with the speaker-adaptive information of optional speaker diarization unit 103 (separate streams of denoised frames for each identified speaker and speech probabilities for each frame) and analyzes the loudness of the content in the recording over time. The whole recording is analyzed and the momentary loudness is computed and stored in memory or on file. The momentary loudness M(n) is a quantity expressed in loudness units full scale (LUFS) and represents the perceptual loudness of a 400 ms fragment of audio. The variable n refers to the n-th frame of audio. In some embodiments, the momentary loudness is computed in real time during the recording process, and stored for later use by leveling unit 108, thus avoiding an additional loudness analysis stage.

The integrated loudness I is also computed, which represents the loudness of the entire file, as described in Algorithms to Measure Audio Programme Loudness and True-peak Audio Level, International Telecommunications Union-Radiocommunication Sector (ITU-R) BS.1770-4 (October 2015). Alternative loudness measures can be used, such as the loudness measures described in B R. J. Moore, B R. R. Glasberg, and T. Baer, "A Model for the Prediction of Thresholds, Loudness, and Partial Loudness," J. Audio Eng. Soc., vol. 45, no. 4, pp. 224-240, (1997 April), or the loudness measures described in Zwicker, E., Fastl, H., Widmann, U., Kurakata, K., Kuwano, S., & Namba, S. (1991). Program for calculating loudness according to DIN 45631 (ISO 532B). *Journal of the Acoustical Society of Japan (E)*, 12(1), 39-42.

In Zwicker et al., partial loudness is estimated which is the estimation of loudness in the presence of noise. It is also contemplated that some scene segmentation could be added, and the integrated loudness performed a scene at a time. In some embodiments, the loudness measures emphasize the energy in a certain frequency band, e.g. the band that contains the frequencies of speech, and can be as simple as measuring the energy in this band.

Dynamic gain analyzer 106 and static gain analyzer 107 compute and apply dynamic and static gains, respectively, to the content over time, so that the resulting loudness range of the speech content in the audio recording fits within the desired target loudness range. More particularly, static gain analyzer 107 determines a static gain $G_s$, which is constant across frames and is used to adjust the overall loudness to a target loudness T (e.g., −23 LUFS). Dynamic gain analyzer 106 determines dynamic gains $G_d$ which may change on a frame-by-frame basis and are used to adjust the loudness range to a desired target loudness range $\Delta L$.

In some embodiments, the loudness range is expressed in decibels and is typically between 3 dB and 6 dB. The momentary loudness M(n) is segmented according to its local minima and maxima, where each segment comprises all the frames between a local maximum and the next local minimum, or between a local minimum and the next local maximum. The target dynamic-gain anchor point $G_d(n_k)$ in dB is then defined for each segment $n_k$ based on the value $M(n_k)$ as shown in Equation [1]:

$G_d(n_k)=I+\Delta L/2-M(n_k)$ if $M(n_k)>I+\Delta L/2$ $G_d(n_k)=(I-\Delta L/2-M(n_k))\cdot c(n_k)$ if $M(n_k)<I-\Delta L/2$ $G_d(n_k)=0$ otherwise [1]

The factor $c(n_k)$ in Equation [1] above is a weight that depends on the VAD value output by VAD 102 at the frame $n_k$. The purpose of $c(n_k)$ is to avoid boosting non-speech parts. In some embodiments, $c(n_k)$ is the speech probability at frame $n_k$. In other embodiments, $c(n_k)$ is a non-linear function of the speech probability, such as the square root of the speech probability, or the sigmoid of the speech probability, where the former corresponds to giving a higher weight to the frames with VAD output closer to 1, and the latter corresponds to a soft threshold on the speech probabilities. In some embodiments, the optional SNR estimation 104 can be used to control parameters of the non-linear function of speech probability that determines $c(n_k)$. For example, when a sigmoid function is used to compress the values of $c(n_k)$ towards the values 0 and 1, the SNR can control the amount of compression. When the signal is noisy, the speech probability is used as determined by VAD 102, and when the speech is clean, the VAD detection is made more discriminative so that speech parts are treated with full leveling.

In some embodiments, the dynamic gains are computed as a continuous function of the distance between the loudness of each frame and the integrated loudness. For example, the dynamic gains can be computed as a continuous function that maps M(n) to the range $[I-\Delta L/2, I+\Delta L/2]$. One example is the sigmoid function given by Equation [2]:

$$G_d(n_k) = \Delta L\left(\frac{1}{1 + e^{-a(I-M(n_k))}} - 0.5\right) - M(n_k), \quad [2]$$

where the gain $G_d(n_k)$ is applied to the audio frames between $n_k$ and $n_{k+1}$.

In some embodiments, the vector of gain anchor points $G_d(n)$ is adapted smoothly over time, to avoid abrupt changes (discontinuities) in adjacent sample frames. When a new gain anchor value is received, the smooth gain is computed by a linear interpolation between the previous and new gain anchor values, over a defined amount of time as shown in Equation [3]:

$$\hat{G}(n+1) = G_d(n) + \Delta G, \text{ where } \Delta G = \frac{[G_d(n+1) - KG_d(n)]}{\tau}, \quad [3]$$

where $\tau$ is a time constant representative of how many seconds it will take for the interpolated gain value $\widehat{G_d}$ to reach the new target gain value $G_d$. Typical values of $\tau$ are 0.1 s in the case where the target gain is larger than the current gain (attack, or boost condition) and 0.25 s in the case where the target gain is smaller than the current gain (e.g., a release or attenuation condition).

In some embodiments, the linear interpolation is computed on linear gain values instead of dB values. In some embodiments, the linear interpolation is replaced by a first-order recursive filter with exponential time constants. An extra gain factor, the static gain $G_s=T-1$, can be applied if a target integrated loudness is given. The amount of leveling can be scaled by multiplying the dynamic gains by a factor between 0.0 and 1.0, where 1.0 corresponds to the full effect, 0.0 corresponds to no leveling, and intermediate values correspond to intermediate amounts of leveling. This amount can be controlled by the SNR estimate so that as the SNR estimate decreases the scaling factor is decreased linearly, to reduce potential artefacts caused by aggressive leveling of noisy content.

In some embodiments, the gains are applied broadband to the signal. In other embodiments, the gains are applied to a specific frequency band, e.g., the band which contains the speech frequencies. Leveling unit 108 applies the smooth gains to the audio by multiplying the sample values of each frame with the corresponding linear gain value. In some embodiments, a limit to the maximum amount of gain boost and the maximum amount of gain attenuation is applied. Typical values of maximum gain are between 10 dB and 20 dB for both boost and attenuation. In case the residual noise is much amplified due to the leveling process, optional SNR denoise unit 109 can be added afterwards. The SNR estimate output by optional SNR estimation unit 104 can also be used to determine a dry/wet mix ratio between the input audio and the processed audio.

Figure 2:
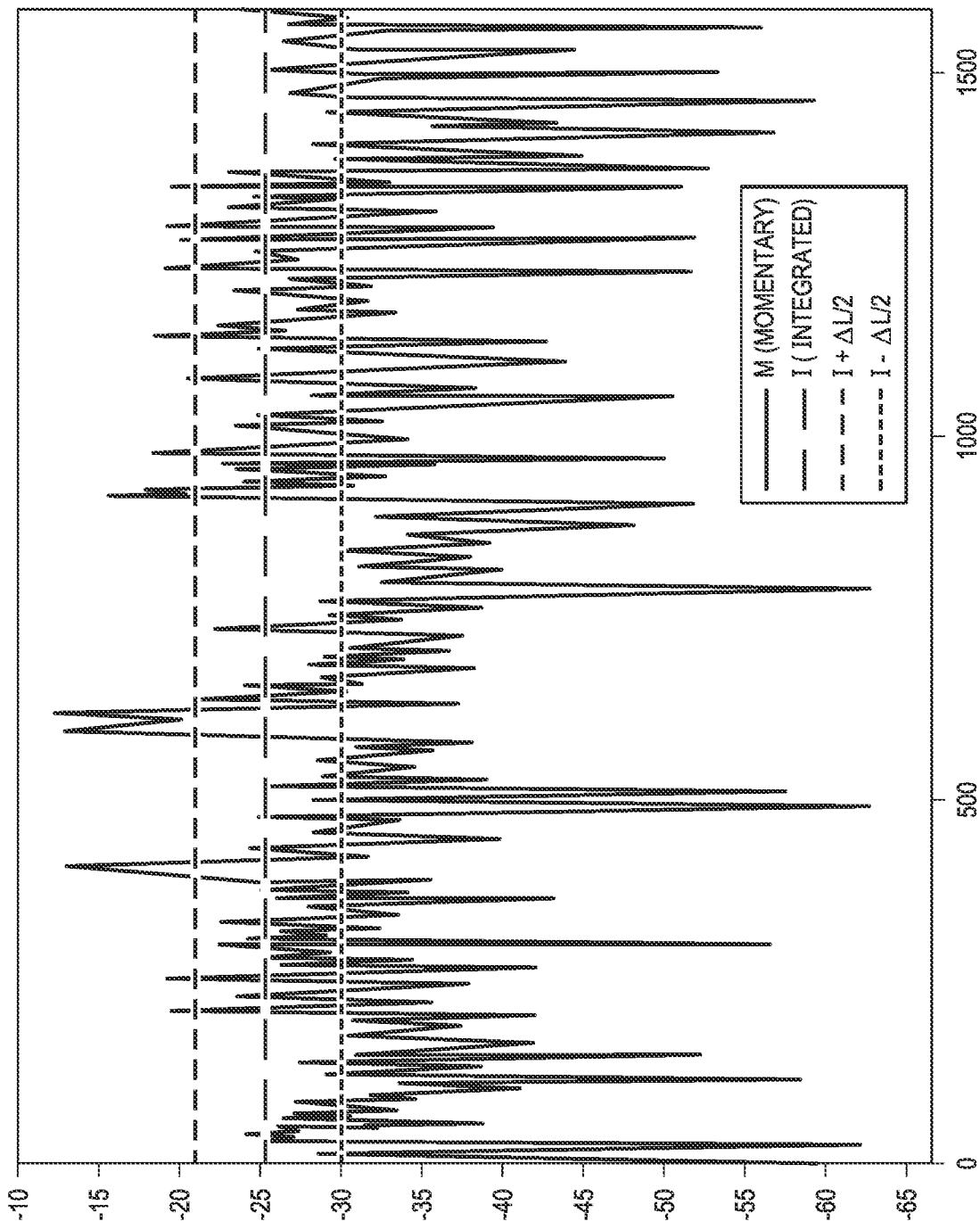
FIG. 2 is a plot illustrating an example of momentary loudness, integrated loudness and target dynamic range boundaries, according to an embodiment.

FIG. 2 is a plot illustrating an example of momentary loudness, integrated loudness gains and target loudness range, according to an embodiment. Note that the target loudness range is the region between I+ΔL/2 and I−ΔL/2], with the integrated loudness being the center of the loudness range. In an embodiment, the target loudness range (e.g., 6 dB) is an input parameter set by a user. In an embodiment, where the audio is streamed, the target loudness range can be set by a broadcaster and included in metadata of the audio stream.

Example Processes

Figure 3:
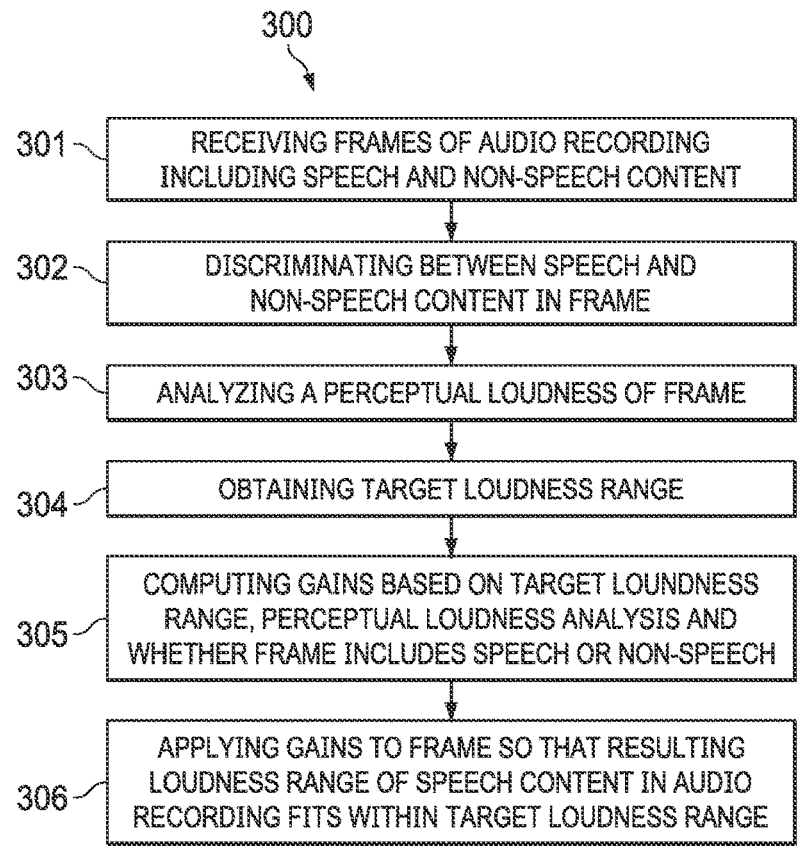
FIG. 3 is a flow diagram of a process for automatic leveling of speech content, according to an embodiment.

FIG. 3 is a flow diagram of a process 300 for automated leveling of speech content, according to an embodiment. Process 300 can be implemented using the device architecture shown in FIG. 4.

Process 300 begins by dividing an audio recording containing speech and non-speech content into frames (301). For each frame, process 300 discriminates between speech and non-speech content (302). For example, a VAD computes a speech probability that indicates whether the frame includes speech content and an SNR estimator gives both a global estimate and local time-varying estimates.

Process 300 then analyzes a perceptual loudness of the frame (303) and obtains a target loudness range for the frame (304).

Process 300 then determines gains based on the target loudness range, perceptual loudness analysis, and whether the frame includes speech or non-speech (305), and applies the gains to the speech content in the frame (306), so that a resulting loudness range of the speech content in the audio recording fits within the target loudness range. For example, static and dynamic gains can be computed. The speech probability output by the VAD and the SNR information can be used to scale the dynamic gains to avoid boosting non-speech content, as described in reference to FIG. 1.

In some embodiments, the gains include a static gain that is applied to all the frames and dynamic gains that change frame-by-frame, and the dynamic gains are computed as a continuous function of the distance between the loudness of each frame and the integrated loudness.

In some embodiments, the dynamic gains of the frames within the desired loudness range with respect to the integrated loudness are unity, and the dynamic gains applied to frames outside the desired loudness range are computed as the difference between the loudness value of the frame and the nearest boundary of the desired loudness range.

In some embodiments, the static gain is the difference between an integrated loudness and a target loudness.

In some embodiments, the gains applied to the frame is the sum of the static gain and the dynamic gain.

In some embodiments, the dynamic gains are multiplied by a coefficient between 0.0 and 1.0.

In some embodiments, the coefficient is a function of the SNR.

In some embodiments, the probability of speech is computed for each frame, and the dynamic gains are scaled with a function of the speech probability.

In some embodiments, the speech probability is computed by a neural network.

In some embodiments, the speech probability is a function of the broadband energy level of each frame.

In some embodiments, the speech probability is a function of the energy level of each frame in a specific frequency band.

In some embodiments, the speech probability can be modified through a sigmoid function, and the sigmoid function's parameter can be either manually fixed or automatically adapted based on the estimated SNR.

In some embodiments, the gains are smoothed over time by linear interpolation over a predefined duration.

In some embodiments, the gains are smoothed over time by summing a fraction of the current value with a fraction of the previous value.

In some embodiment, the loudness of each frame is computed at recording time and stored.

In some embodiments, the loudness information is read from metadata that has been pre-calculated from the audio.

In some embodiments, the speech probability is computed at recording time and stored.

In some embodiments, the loudness is the momentary loudness.

In some embodiments, the energy in a frequency band is used as a measure of level In some embodiments, the gains are applied to a specific frequency band of the signal.

In some embodiments, a boost or attenuation provided by the gains is a limited to a predefined maximum value.

In some embodiments, the speech content may contain multiple speakers with different SNRs, and speaker diarization (e.g., speaker diarization 103) is used to segment the content according to speaker identities prior to SNR estimation, wherein the segments that belong to each speaker are processed separately from segments belonging to the other speakers.

In some embodiments, the audio recording is pre-processed using the techniques described above, and the resulting leveling gains are included in metadata or speech content frames in a bitstream that is streamed to one or more decoding devices, where the gains are extracted from the metadata by the decoder and applied by the decoder to the frames of the speech content.

Example System Architecture

Figure 4:
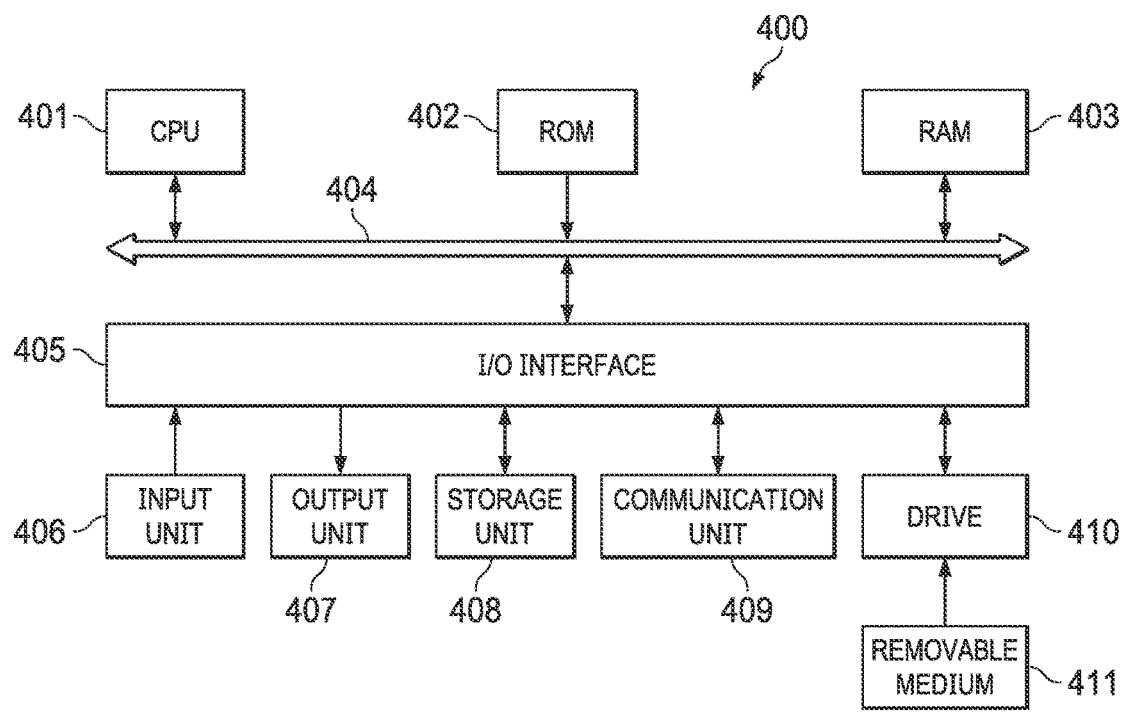
FIG. 4 is a block diagram of an example device architecture for implementing the system and method of FIGS. 1-3, according to an embodiment.

FIG. 4 shows a block diagram of an example system 400 suitable for implementing example embodiments of the present disclosure. System 400 includes any devices that are capable of playing audio, including but not limited to: smartphones, tablet computers, wearable computers, vehicle computers, game consoles, surround systems, kiosks.

As shown, the system 400 includes a central processing unit (CPU) 401 which is capable of performing various processes in accordance with a program stored in, for example, a read only memory (ROM) 402 or a program loaded from, for example, a storage unit 408 to a random access memory (RAM) 403. In the RAM 403, the data required when the CPU 401 performs the various processes is also stored, as required. The CPU 401, the ROM 402 and the RAM 403 are connected to one another via a bus 404. An input/output (I/O) interface 405 is also connected to the bus 404.

The following components are connected to the I/O interface 405: an input unit 406, that may include a keyboard, a mouse, or the like; an output unit 407 that may include a display such as a liquid crystal display (LCD) and one or more speakers; the storage unit 408 including a hard disk, or another suitable storage device; and a communication unit 409 including a network interface card such as a network card (e.g., wired or wireless).

In some implementations, the input unit 406 includes one or more microphones in different positions (depending on the host device) enabling capture of audio signals in various formats (e.g., mono, stereo, spatial, immersive, and other suitable formats).

In some implementations, the output unit 407 include systems with various number of speakers. As illustrated in FIG. 4, the output unit 407 (depending on the capabilities of the host device) can render audio signals in various formats (e.g., mono, stereo, immersive, binaural, and other suitable formats).

The communication unit 409 is configured to communicate with other devices (e.g., via a network). A drive 410 is also connected to the I/O interface 405, as required. A removable medium 411, such as a magnetic disk, an optical disk, a magneto-optical disk, a flash drive or another suitable removable medium is mounted on the drive 410, so that a computer program read therefrom is installed into the storage unit 408, as required. A person skilled in the art would understand that although the system 400 is described as including the above-described components, in real applications, it is possible to add, remove, and/or replace some of these components and all these modifications or alteration all fall within the scope of the present disclosure.

In accordance with example embodiments of the present disclosure, the processes described above may be implemented as computer software programs or on a computer-readable storage medium. For example, embodiments of the present disclosure include a computer program product including a computer program tangibly embodied on a machine readable medium, the computer program including program code for performing methods. In such embodiments, the computer program may be downloaded and mounted from the network via the communication unit 809, and/or installed from the removable medium 411, as shown in FIG. 4.

Generally, various example embodiments of the present disclosure may be implemented in hardware or special purpose circuits (e.g., control circuitry), software, logic or any combination thereof. For example, the units discussed above can be executed by control circuitry (e.g., a CPU in combination with other components of FIG. 4), thus, the control circuitry may be performing the actions described in this disclosure. Some aspects may be implemented in hardware, while other aspects may be implemented in firmware or software which may be executed by a controller, microprocessor or other computing device (e.g., control circuitry). While various aspects of the example embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

Additionally, various blocks shown in the flowcharts may be viewed as method steps, and/or as operations that result from operation of computer program code, and/or as a plurality of coupled logic circuit elements constructed to carry out the associated function(s). For example, embodiments of the present disclosure include a computer program product including a computer program tangibly embodied on a machine readable medium, the computer program containing program codes configured to carry out the methods as described above.

In the context of the disclosure, a machine readable medium may be any tangible medium that may contain, or store a program for use by or in connection with an instruction execution system, apparatus, or device. The machine readable medium may be a machine readable signal medium or a machine readable storage medium. A machine readable medium may be non-transitory and may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Computer program code for carrying out methods of the present disclosure may be written in any combination of one or more programming languages. These computer program codes may be provided to a processor of a general purpose computer, special purpose computer, or other programmable data processing apparatus that has control circuitry, such that the program codes, when executed by the processor of the computer or other programmable data processing apparatus, cause the functions/operations specified in the flowcharts and/or block diagrams to be implemented. The program code may execute entirely on a computer, partly on the computer, as a stand-alone software package, partly on the computer and partly on a remote computer or entirely on the remote computer or server or distributed over one or more remote computers and/or servers.

While this document contains many specific implementation details, these should not be construed as limitations on the scope of what may be claimed, but rather as descriptions of features that may be specific to particular embodiments.

Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination. Logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method comprising:
receiving, using one or more processors, frames of an audio recording including speech and non-speech, where the speech includes speech from multiple speakers with different signal-to-noise ratios (SNRs);
detecting speech frames in the speech content and their respective speech probabilities;
segmenting the speech frames into separate streams according to the identities of the multiple speakers, wherein segmenting is based on time indices to indicate where each of the multiple speakers is actively dominant in the audio recording;
for each frame in each one of the separate streams:
analyzing, using the one or more processors, a perceptual loudness of the frame, the analyzing including determining an integrated loudness and a momentary loudness;
obtaining, using the one or more processors, a target loudness range for the frame;
in response to a first condition being met, setting a dynamic gain for the frame as a function of the integrated loudness, the target loudness range, the momentary loudness and a non-linear function of the speech probability for the frame, wherein the non-linear function of the speech probability is configured to avoid boosting non-speech parts of the audio;
in response to a second condition being met, setting the dynamic gain for the frame as a function of the integrated loudness, the target loudness range, and the momentary loudness for the frame, wherein the second condition is different than the first condition;
and otherwise, when both the first and second conditions are not met, setting the dynamic range to zero; and
applying, using the one or more processors, the dynamic gains to the frame so that a resulting loudness range of the speech content in the audio recording fits within the target loudness range.

2. The method of claim 1, further comprising:
computing, using the one or more processors, a static gain that is applied to all the frames.

3. The method of claim 2, where the static gain is the difference between an integrated loudness and a target loudness.

4. The method of claim 2, where the gain applied to each frame is the sum of the static gain and the dynamic gain for the frame.

5. The method of claim 1, wherein the dynamic gains are computed as a continuous function of a distance between the perceptual loudness of each frame and an integrated loudness.

6. The method of claim 1, wherein the dynamic gains of the frames within a desired loudness range with respect to the integrated loudness are unity, and the dynamic gains applied to frames outside the desired loudness range are computed as the difference between the frame's loudness value and the nearest boundary of the desired loudness range.

7. The method of claim 1, where the dynamic gains are multiplied by a coefficient between 0.0 and 1.0.

8. The method of claim 1, where the speech probability is computed by a neural network.

9. The method of claim 1, where the speech probability is a function of a broadband energy level of each frame.

10. The method of claim 1, further comprising:
estimating a signal-to-noise ratio (SNR); and
modifying the speech probability based at least in part on the estimated SNR.

11. The method of claim 10, where the speech probability is determined by a voice activity detector (VAD), and the method further comprises:
adjusting a sensitivity of the VAD to increase discrimination between speech and non-speech when the estimated SNR indicates the speech content is clean.

12. The method of claim 1, further comprising:
estimating a signal-to-noise ratio (SNR); and
adjusting the target loudness based on the estimated SNR so that a small dynamic range is only achieved when the speech content is clean.

13. The method of claim 10, where the dynamic gains are multiplied by a coefficient between 0 and 1, and the coefficient is a function of the SNR.

14. The method of claim 1, where the speech probability can be modified through a sigmoid function, and wherein a parameter of the sigmoid function is either manually fixed or automatically adapted based on the estimated SNR of the speech content.

15. The method of claim 1, where the speech probability is a function of the energy level of each frame in a specific frequency band.

16. The method of claim 1, where the perceptual loudness of each frame is computed at recording time and stored.

17. The method of claim 1, where the speech probability is computed at recording time and stored.

18. The method of claim 12, wherein the estimated SNR is used to control a parameter of the non-linear function of the speech probability.

19. A system comprising:
one or more processors; and
a non-transitory computer-readable medium storing instructions that, upon execution by the one or more processors, cause the one or more processors to perform operations of the method of claim 1.

20. A non-transitory, computer-readable medium storing instructions that, upon execution by one or more processors, cause the one or more processors to perform operations of the method of claim 1.

* * * * *